United States Patent [19]

Iijima et al.

[11] Patent Number: 5,563,445
[45] Date of Patent: Oct. 8, 1996

[54] SEMICONDUCTOR DEVICE

[75] Inventors: Yoshitaka Iijima; Shigeaki Seki, both of Suwa, Japan

[73] Assignee: Seiko Epson Corporation, Tokyo, Japan

[21] Appl. No.: 351,383

[22] PCT Filed: Apr. 4, 1994

[86] PCT No.: PCT/JP94/00551

§ 371 Date: Mar. 13, 1995

§ 102(e) Date: Mar. 13, 1995

[87] PCT Pub. No.: WO94/24698

PCT Pub. Date: Oct. 27, 1994

[30] Foreign Application Priority Data

Apr. 8, 1993 [JP] Japan .................. 5-082207

[51] Int. Cl.$^6$ .................. H01L 23/48; H01L 23/52; H01L 23/04
[52] U.S. Cl. .................. 257/698; 257/786; 257/693
[58] Field of Search .................. 257/780, 781, 257/786, 737, 738, 698, 692, 693

[56] References Cited

U.S. PATENT DOCUMENTS

| | | |
|---|---|---|
| 3,871,015 | 3/1975 | Lin et al. .................. 257/780 |
| 5,186,383 | 2/1993 | Melton et al. . |
| 5,198,963 | 3/1993 | Gupta et al. .................. 257/737 |
| 5,400,950 | 3/1995 | Myers et al. . |

FOREIGN PATENT DOCUMENTS

| | | |
|---|---|---|
| 53-123074 | 10/1978 | Japan . |
| 60-001968 | 1/1985 | Japan . |
| 60-31244 | 2/1985 | Japan . |
| 62-086737 | 4/1987 | Japan . |
| 63-95639 | 4/1988 | Japan . |
| 1-019752 | 1/1989 | Japan . |
| 1-319957 | 12/1989 | Japan . |
| 3126237 | 5/1991 | Japan . |
| 5-074852 | 3/1993 | Japan . |

*Primary Examiner*—Mahshid Saadat
*Assistant Examiner*—S. V. Clark
*Attorney, Agent, or Firm*—Eric B. Janofsky

[57] ABSTRACT

A semiconductor chip is positioned over the device hole of a circuit board which includes an insulating flexible substrate. The electrode bumps of the semiconductor chip are bonded to the lead portions of the conductive pattern, which protrude into the device hole by using the single-point bonding method. The circuit board includes superimposing areas of the substrate that overlie the semiconductor chip at the four corner areas of the device hole, as well as the superimposing area that divides the device hole into the four holes. Dummy bumps are provided on the areas of the semiconductor chip that overlap these superimposing areas. The dummy bumps are not to be bonded to the conductive pattern and are positioned between the circuit board and the semiconductor chip to maintain a specified distance between the two. Furthermore, a through-hole is provided in the superimposing area to allow air to escape when a molding agent is injected through the holes.

26 Claims, 4 Drawing Sheets

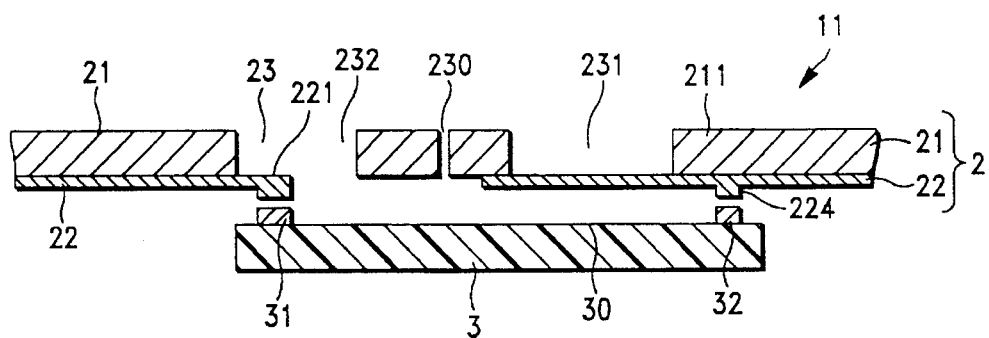
FIG.—4A
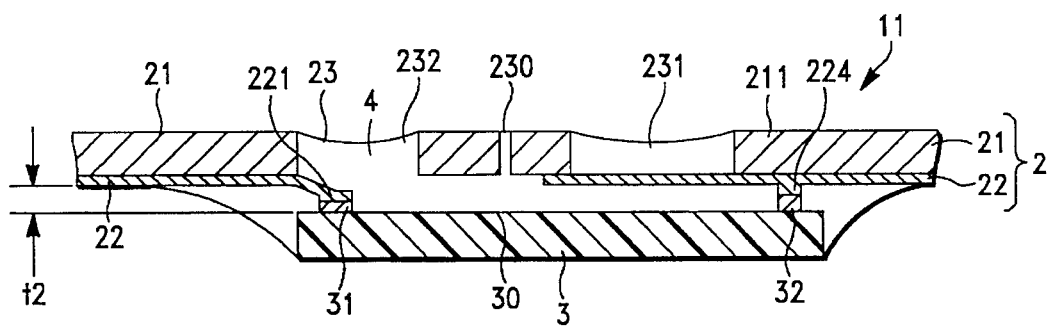
FIG.—4B
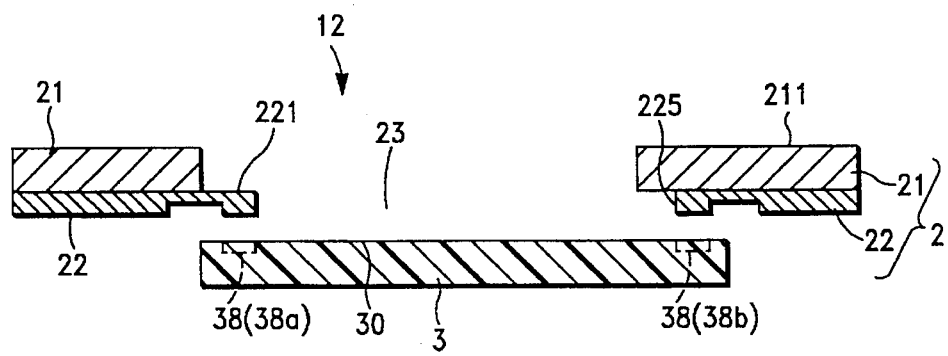
FIG.—5A
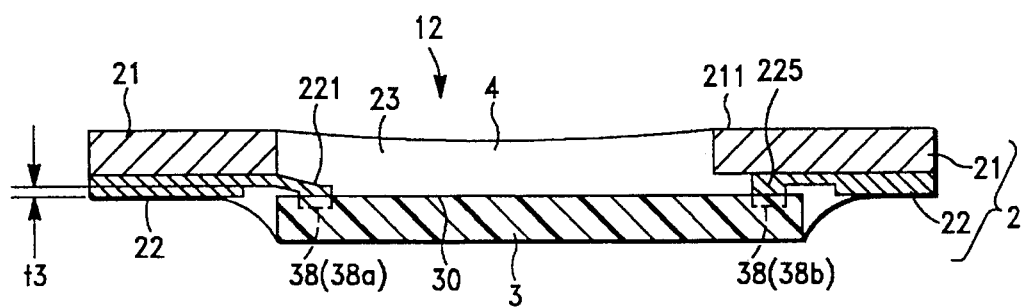
FIG.—5B

SEMICONDUCTOR DEVICE

BACKGROUND OF THE INVENTION

1. Field of technology

This invention relates to a semiconductor device, particularly one with a structure suitable for the assembly of a relatively large-sized semiconductor chip, and a structure suitable for the assembly of a semiconductor chip onto a flexible circuit board that is often used in quartz watch applications.

2. Background Technology

In the assembly of a semiconductor chip onto a circuit board, such as shown in FIG. 7, a molding agent 55 is injected through a device hole 53, after the lead 521 of the conductive pattern 52 formed on the circuit board 51, which protrudes into the device hole 53, is bonded to the bump 541 of the semiconductor chip 54. This lead 521 is usually formed downward to prevent short-circuiting between the edge of the semiconductor chip 54 and the conductive pattern 52.

However, in this type of assembly structure, the lead 521 is bent to a great degree, with the result of increasing the thickness of the semiconductor device. Furthermore, during the lead-forming process, increases in the number of leads 521 also result in increases in the irregularity of the shape and position of each lead. Consequently, in the assembly of a large-sized semiconductor chip 54, these forming-related irregularities result in some of the bumps 541 not being bonded to the leads 521. Furthermore, the device hole 55 must be enlarged as the size of the semiconductor chip 54 increases, thus increasing the planar area of the semiconductor device. For this reason, this assembly method cannot be used in electronic instruments, such as quartz watches, which require small size.

One possible method of increasing stability against warpage, etc., in the assembly of a large-size semiconductor chip 54, is as follows. Reinforcing dummy bumps, which are electrically insulated from the internal circuit, are formed on the side of the semiconductor chip 54. Bonding in the additional areas made available by these dummy bumps is used to increase the bonding strength between the semiconductor chip 54 and the circuit board 52. However, the dummy bump connection used in this type of structure also requires a forming process, and thus the above-mentioned problems associated with the forming process cannot be eliminated.

Another assembly structure suitable for achieving thin semiconductor device profile uses a method in which a solder bump 62 formed on the semiconductor chip 61 is heated under pressure and bonded with the conductive pattern 64 of the circuit board 63, as shown in FIG. 8. In this type of assembly structure, because part of the circuit board 63 overlaps the active area of the semiconductor chip 61, the conductive pattern 64 can also be formed in this overlapping area. This results in a high degree of pattern design freedom, which is suitable to achieving thin semiconductor device profile. However, the solder bump 62 does require a complicated manufacturing process, thus resulting in high manufacturing cost. Furthermore, because the semiconductor chip 61 must be heated first and then cooled during the process of assembling the semiconductor chip 61 onto the circuit board 63, the resulting long manufacturing throughput makes it difficult to reduce costs.

In an assembly structure using this kind of solder bump 62, possible methods of preventing short-circuiting between the circuit board 63 and the semiconductor chip 61 include increasing the thickness of the solder bump 62, or forming dummy solder bumps. However, as long as solder bumps are used, the above-mentioned manufacturing-related problem will remain.

In order to solve these problems, the invention is intended to provide thinner-profile, lower-cost semiconductor devices, while achieving reliability superior to that attainable using conventional assembly structures, even when single-point or gang bonding methods are used. Additionally, the invention is intended to provide semiconductor devices with improved pattern design freedom.

SUMMARY OF THE INVENTION

In order to solve the above-mentioned problems, the invention is characterized in that, in a semiconductor device comprising a circuit board in which a conductive pattern has been formed on an insulating substrate, and a semiconductor chip positioned over the device hole of the said circuit board; whereas the part of the conductive pattern protruding into the device hole is bonded to the bump of the semiconductor chip; a superimposing area overlapping the semiconductor chip is formed on the circuit board, and a spacer is formed either on the said superimposing area or on the overlapping area of the semiconductor chip, such that the thickness of the spacer does not change before or after the conductive pattern is bonded to the bumps, and such that the said spacer is positioned between the said circuit board and the said semiconductor chip to maintain a specified distance between the two.

For example, the invention is characterized in that dummy bumps are formed on the part of the semiconductor chip that overlaps the superimposing area, such that the said dummy bumps are not bonded to the conductive pattern, and which act as the spacer that maintains a specified distance between the circuit board and the semiconductor chip.

In other words, a specified distance is automatically maintained between the circuit board and the semiconductor chip by the dummy bumps, which are not flattened during the bonding process, and thus retain the same thickness. This prevents the occurrence of short-circuiting between the edge of the semiconductor chip and the conductive pattern. Therefore, a forming process need not be applied to the leads when either single-point or gang bonding methods are used. Furthermore, it removes the necessity for solder bumps, reducing the cost of which is difficult. Because of these factors, it is possible to produce a semiconductor device possessing higher reliability, thinner profile, and lower cost than conventional semiconductor devices. High reliability is obtained because the gap dimension is determined by the pre-established initial thickness of the spacer, e.g., dummy bumps. Additionally, dummy bumps do not raise semiconductor chip cost since they can be formed simultaneously with the bumps for bonding.

In this invention, "dummy" means that no electrical circuit connection is required, and the above-mentioned dummy bumps, as well as the dummy pads mentioned later, are electrically insulated from the internal circuit of the semiconductor chip. Furthermore, in this invention, a "bump" refers to a thick electrode that protrudes from areas such as the active area of the semiconductor chip, and a "pad" to an electrode that does not protrude from the active area of the semiconductor chip.

In addition to dummy bumps and dummy pads, it is possible to use as spacers, dummy conductive patterns which are not electrically connected to other electrical circuits on the circuit board side, and for which no electrical circuit connection is required.

In this invention, it is desirable that the conductive pattern overlap the dummy bumps in the superimposing area. This is because the gap between the edge of the semiconductor chip and the conductive pattern can be better maintained when the dummy bumps overlap the conductive pattern itself.

Another example of the invention is characterized in that a protruding conductive pattern is formed, which is not bonded to the bonding electrode, and which acts as a spacer that maintains a specified distance between the circuit board and the semiconductor chip. In this case also, a specified distance is automatically maintained between the circuit board and the semiconductor chip by the protruding conductive pattern, which is not flattened by the bonding process, thus retaining its initial thickness. For this reason, no forming process is required when either single-point or gang bonding methods are used.

In this case, it is more desirable for bumps to be formed on the semiconductor chip side as bonding electrodes, and for dummy bumps, which are not to be bonded to the protrusions, to be formed in those locations corresponding to the protrusions. This is because the gap dimension can be expanded in proportion to the thickness of the dummy bump.

It is also acceptable for pads to be formed on the semiconductor chip side as bonding electrodes, and for dummy pads, which are not to be bonded to the protrusions, to be formed in those locations corresponding to the protrusions.

In this invention, in those cases in which the device holes are approximately quadrangular in outline, it is better if superimposing areas are formed in the four corner areas. Furthermore, it is desirable that superimposing areas also be formed on each side of the device holes. This allows a stable distance to be maintained between the circuit board and the semiconductor chip.

Furthermore, it is desirable that a superimposing area be formed inside the device hole, dividing the said device hole into multiple holes. This allows the molding agent to spread more easily when injected through multiple holes. In particular, it is desirable that the superimposing area cross the approximate center of the device hole, dividing it into multiple holes, and that a through-hole be formed in the section of the superimposing area corresponding to the approximate center of the device hole. This through-hole is intended to facilitate the escaping of air when a molding agent is injected.

Furthermore, if the device hole is divided into multiple holes, a conductive pattern possessing an area that crosses over the hole can be formed when positioning the wiring on the active side of the semiconductor chip. This type of cross-over area is very strong because it is supported and reinforced by the superimposing area. Therefore, it becomes possible to increase the design freedom of the wiring pattern.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 2A shows a longitudinal section of FIG. 1, along Line I–II; while

FIG. 3A is a longitudinal section that schematically shows the structure of the semiconductor device related to Working example 1 of the invention before bonding, while

FIG. 4A is a longitudinal section that schematically shows the structure of the semiconductor device related to Working example 2 of the invention before bonding, while FIG. 4B is a longitudinal section that schematically shows the structure of the semiconductor device in Working example 2 of the invention after bonding.

FIG. 5A is a longitudinal section that schematically shows the structure of the semiconductor device related to Working example 3 of the invention before bonding, while FIG. 5B is a longitudinal section that schematically shows the structure of the semiconductor device in Working example 3 of the invention after bonding.

DESCRIPTION OF THE PREFERRED EMBODIMENTS

Working Example 1

Figure 1:
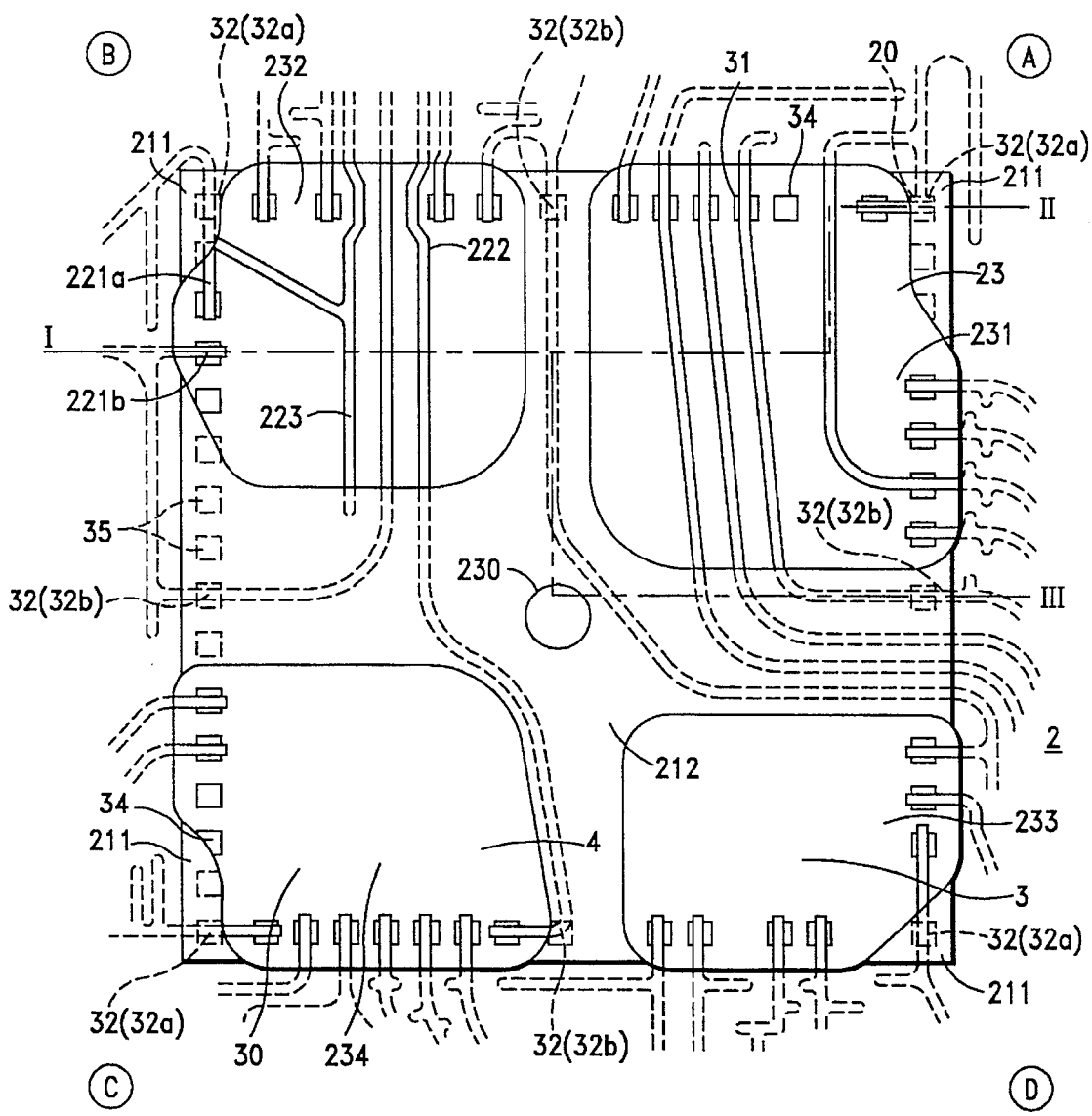
FIG. 1 is a top view of the configuration of the semiconductor device related to Working example 1 of the invention.
Figure 2A:
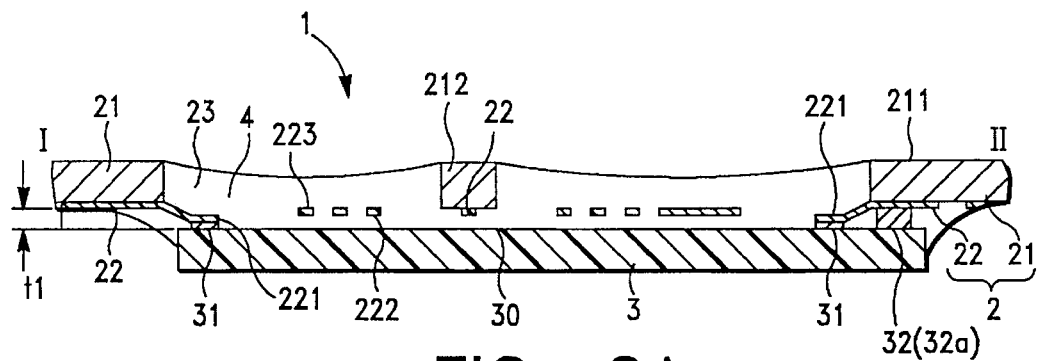

FIG. 1 shows the top view of the semiconductor device related to Working example 1 of the invention. FIG. 2A shows a longitudinal section of FIG. 1, along Line I–II; and FIG. 2B, a longitudinal section of FIG. 1, along Line I–III.

Figure 2B:
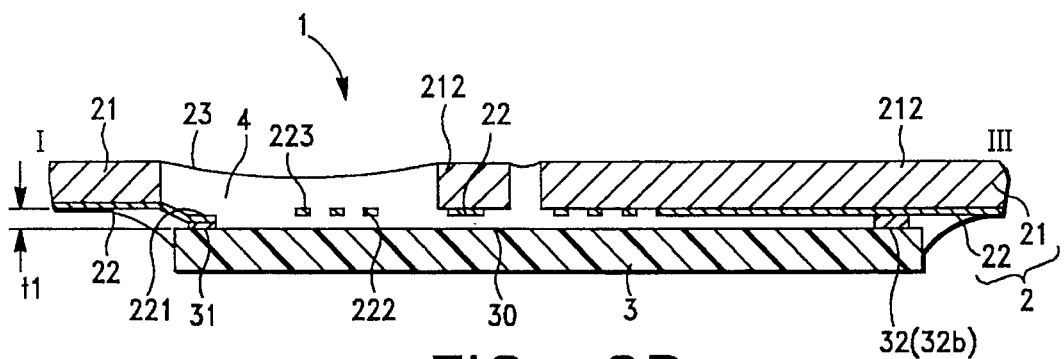
FIG. 2B shows a longitudinal section of FIG. 1, along Line I–III.

In FIGS. 1, 2A, and 2B, the semiconductor device 1 in the example is used as a circuit block in an analog multifunction electronic watch, and comprises a circuit board 2 and a semiconductor chip 3 containing a CPU.

The active area 30 of the semiconductor chip 3 is approximately 5 mm × 5 mm in size, on which 36 bumps 31 that require bonding have been formed. Semiconductor chips ordinarily used for quartz watches are approximately 2 mm × 2 mm in size, and possess over 10 bumps. Thus, the semiconductor chip 3 in this example possesses approximately six times the area of and more than twice the number of bonding locations than an ordinary semiconductor chip.

The circuit board 2 comprises a flexible substrate 21 which is made of an approximately 130 µm-thick polyimide resin tape, and a conductive pattern 22 (lead) which is integrated onto this substrate 21. The conductive pattern 22 is a conductive component, produced when the copper foil adhered to the substrate 21 is formed into a specified pattern on which gold plating of approximately 1 µm thickness has been applied.

The area of the substrate 21 that corresponds to the position of the semiconductor chip 3 has been removed from the circuit board 2 to form a device hole 23 which is approximately quadrangular in outline. The semiconductor chip 3 is positioned on this device hole 23 and secured.

This securing structure will be explained in more detail later. However, in this structure, the device hole 23 is filled with a molding agent 4 after the leads 221, which are part of the conductive pattern 22 and which protrude into the device hole 23 are bonded to the bumps 31 of the semiconductor chip 3, using the single-point bonding method, one location after another. The width of the leads 221 is narrower than that of other conductive patterns 22, making it easier to bond with the bumps 31. Here, the bumps 31 were flattened when being bonded with the leads 221, and the leads 221 are bent slightly downward.

In a semiconductor device 1 possessing the type of bonding structure in this example, the superimposing areas 211 of the circuit board 2 that overlap with the corners of the semiconductor chip 3 have been formed in the four corner regions, A, B, C, and D, of the device hole 23. Also, dummy bumps 32a (spacers) have been formed in four locations in the active area 30 of the semiconductor chip 3, which overlaps the superimposing area 211. These dummy bumps 32a overlap the expanded width portion 20 of the conductive pattern 22. This wider width ensures that dummy bumps 32a will overlap the conductive pattern 22, even if the semiconductor chip 3 is slightly misaligned. However, because the dummy bumps 32a are not electrically connected to any of the internal circuits of the semiconductor chip 3, they cannot cause a malfunction of the semiconductor device 1. Although the dummy bumps 32a overlap the conductive pattern, they are not bonded to the conductive pattern 22 (the leads 221). Consequently, the dummy bumps 32a are not flattened and retain their initial thickness, unlike the bumps 31.

A superimposing area 212 of the circuit board 2 has also been formed inside the device hole 23, which overlaps the semiconductor chip 3. The superimposing area 212 passes the approximate center of the device hole 23, and is connected to the approximate center of each of the four sides. Dummy bumps 32b (spacers) have been formed in four locations in the active area 30 of the semiconductor chip 3, which overlaps the superimposing area 212. These dummy bumps 32b are not electrically connected to any of the internal circuits of the semiconductor chip 3. Furthermore, because the dummy bumps 32b are not bonded to the conductive pattern 22 (leads 221), they are not flattened, thus retaining their initial thickness, unlike the bumps 31.

A high level of productivity can be achieved in the semiconductor device 1 configured in this way, because solder bumps are not used. Additionally, as shown in FIGS. 2A and 2B, a gap t1 is automatically maintained between the circuit board 2 and the semiconductor chip 3 by the dummy bumps 32 (32a and 32b) and has a thickness equivalent to that of the dummy bumps. This prevents the occurrence of short-circuiting between the conductive pattern 22 and the edge of the semiconductor chip 3.

Furthermore, because the thickness of the dummy bumps 32 is not affected by the process of bonding the leads 221 to the bumps 31, the dimension of the gap t1 is determined by the initially-specified thickness of the dummy bumps 32. Also, because the dummy bumps 32 overlap the conductive pattern 22, they reliably maintain the gap t1 between the conductive pattern 22 and the semiconductor chip 3, thus ensuring the high reliability of the semiconductor device 1. Furthermore, the dummy bumps 32 do not raise the cost of the semiconductor chip 3 because they can be formed simultaneously with the bonding bumps 31.

Figure 3A:
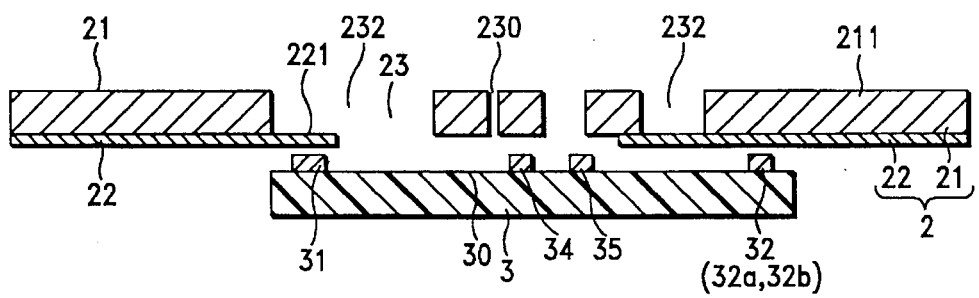
Figure 3B:
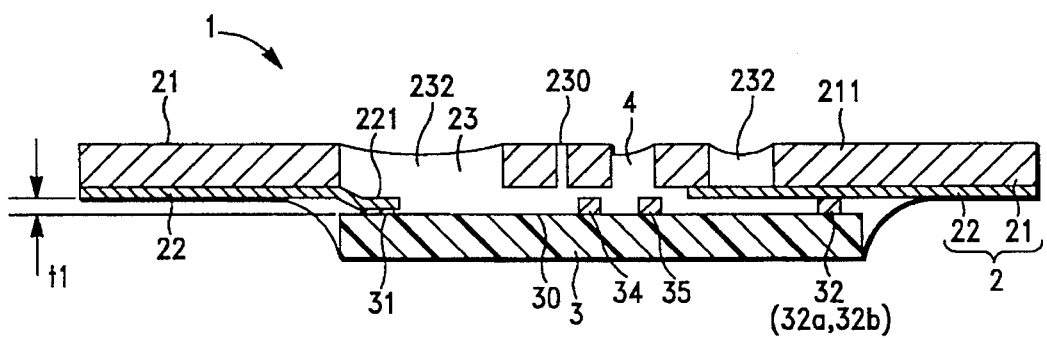
FIG. 3B is a longitudinal section that schematically shows the structure of the semiconductor device in Working example 1 of the invention after bonding.
Figure 7:
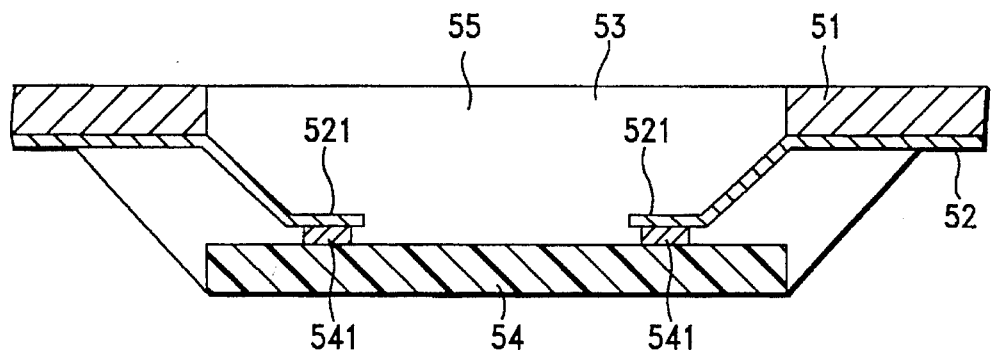
FIG. 7 is a longitudinal section showing the configuration of a conventional semiconductor device.
Figure 8:
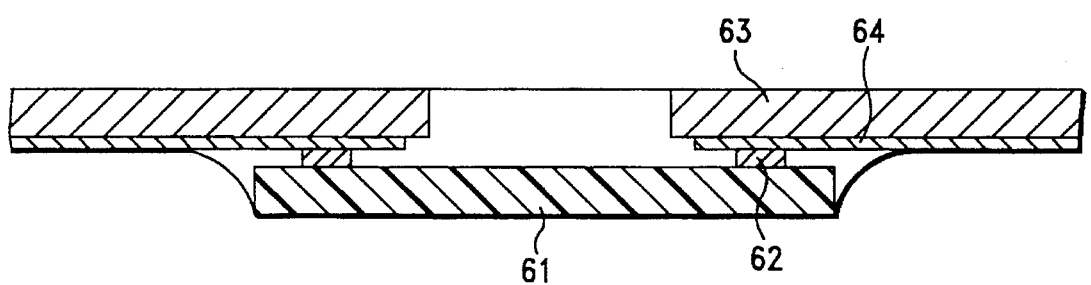
FIG. 8 is a longitudinal section showing the configuration of another conventional semiconductor device.

As schematically shown in FIG. 3A, a longitudinal section before the bonding process, free dummy bumps 34 and 35 have been formed in the active area 30, which are not electrically required nor used for maintaining the gap t1. These free dummy bumps are in addition to the bumps 31 which are electrically required, and to the dummy bumps 32 which are necessary for maintaining the gap t1. The free dummy bump 34 is positioned inside the area where the device hole 23 has been formed. Although the free dummy bump 35 is positioned inside the area where the superimposing area 212 has been formed, it does not contact the circuit board 2 because no conductive pattern 22 has been formed there, as shown in FIG. 3B, a longitudinal section after the bonding process. When free dummy bumps, such as 34 and 35, are formed, they can be used to secure a specified gap t1 between the semiconductor chip 3 and the circuit board 2, for example, when the location of the superimposing areas 211 and 212 is changed on the circuit board 2.

Additionally, the semiconductor device 1 in this example possesses the following characteristics.

Again, in FIG. 1, the device hole 23 has been divided by the superimposing area 212 into four holes, 231, 232, 233, and 234. In this case, the cross-over area 222 of the conductive pattern 22 only needs to transverse one of the holes, 232, even when it has been formed to transverse the entire device hole 23, and in addition, is reinforced by the superimposing area 212. Likewise, the cross-over area 223 of the conductive pattern 22 transverses only the hole 232, and its tip is supported by the superimposing area 212. Consequently, this cross-over area can be freely positioned in those areas that correspond to the active area 30 of the semiconductor chip 3, and the resulting conductive pattern will be very strong. Furthermore, because the circuit board 2 can be reinforced by retaining the superimposing areas 211 and 212 inside the device hole 23, the flexible circuit board 2 can be protected against unnecessary deformation.

Furthermore, because the interior perimeter of the device hole 23 is formed into a complicated shape by the superimposing areas 211 and 212, the leads 221 can be made to protrude in either the longitudinal or the transverse direction. For example, the lead 221a can be made to protrude along the interior perimeter of the device hole 23. Consequently, leads that are positioned in orthogonal directions to each other 221a and 221b can be formed even near the center of a side of the device hole 23, allowing for a high degree of wiring freedom. For these reasons, the semiconductor device 1 in this example is highly reliable, possesses a high degree of design freedom, and can be used in a wide range of applications.

In addition, the superimposing area 212 has been formed to divide the device hole 23 by passing through the approximate center of the device hole 23. Furthermore, a through-hole 230 has been formed in the area of the superimposing area 212 that corresponds to the center of the device hole 23, i.e., the approximate center of the semiconductor chip 3. This structure offers the advantage of high productivity in assembly processing, as explained below.

The process of assembling the semiconductor chip 3 to the circuit board 2 will be explained, with reference to FIGS. 3A and 3B.

First, as shown in FIG. 3A, the position of the semiconductor chip 3 relative to the device hole 23 of the circuit board 2 is determined. In this state, the superimposing area 211 overlaps the semiconductor chip 3.

From this state, the leads 221 and the bumps 31 are bonded, one location at a time, by applying ultrasonic vibration to the leads 221. As a result, as shown in FIG. 3B, the leads 221 are bent downward while the bumps 31 are flattened.

In contrast, because the dummy bumps 32 are not bonded to the conductive pattern 22, they retain their initial thickness even after the bumps 31 and the leads 221 are bonded. Consequently, the gap t1, which is equivalent to the initial thickness of the dummy bumps 32, is maintained between the circuit board 2 and the semiconductor chip 3.

Next, the molding agent 4 is injected into the device hole 23. Here, the device hole 23 has been divided into four holes, 231, 232, etc., and the molding agent 4 is injected into each of these holes, 231, 232, etc. This allows the molding agent 4 to flow smoothly. Furthermore, the through-hole 230 has been formed in the section of the superimposing areas 211 and 212 that corresponds to the center of the device hole 23. Air can escape through this through-hole 230 when the molding agent 4 is injected, allowing for the smooth flow of the molding agent 4, and thus, achieving high productivity in assembly processing.

In this example, the dummy bumps 32 overlap the conductive pattern 22 that has been formed in the superimposing area 211 of the circuit board 2. However, if the rigidity of the substrate 21 is relatively high, and if it is not necessary for the thickness of the conductive pattern 22 to contribute to the dimension of the gap t1, a structure can be used in which the dummy bumps 32 directly overlap the substrate 21 itself in the superimposing area 211.

Working Example 2

The basic structure of the semiconductor device in this example is the same as that of the semiconductor device in Working example 1. For this reason, where the functions are the same, the same notations have been used and detailed explanations omitted.

FIG. 4A is a longitudinal section that schematically shows the state of the semiconductor device in this example before the semiconductor chip is bonded to the circuit board, while FIG. 4B is a longitudinal section that schematically shows the state after the semiconductor chip is bonded to the circuit board.

As in the semiconductor device in Working example 1, in the semiconductor device 11 of this example shown in FIG. 4A, a bump 31 (electrode for bonding), which is necessary for the electrical circuit, and a dummy bump 32 (spacer), which is not necessary for the electrical circuit, have been formed in the active area 30 of the semiconductor chip 3. A device hole 23 has been formed on the side of the circuit board 2, and the lead 221 of the conductive pattern 22 protrudes into this hole. Furthermore, the circuit board 2 possesses a superimposing area 211 which overlaps the semiconductor chip 3 when this semiconductor chip 3 is correctly positioned against the device hole 23. A conductive pattern 22 has also been formed in this superimposing area 211.

In this example, a protrusion 224 (spacer) that juts out from the conductive pattern 22, has been formed in the area of the conductive pattern 22 (which has been formed in the superimposing area 211) that overlaps the dummy bump 32 when the semiconductor chip 3 is correctly positioned against the circuit board 2. This protrusion 224 is a bump that has been transferred to the side of the circuit board 2.

Therefore, when the lead 221 and the bump 31 are bonded by applying ultrasonic vibration to the lead 221 in the single-point bonding method, the lead 221 is bent downward while the bump 31 is flattened, as shown in FIG. 4B.

In contrast, because the dummy bump 32 and the conductive pattern 22 (protrusion 224) are not bonded, the dummy bump 32 retains its initial shape and thickness even after the lead 221 and the bump 31 are bonded. The protrusion 224 also retains its initial shape and thickness. A gap t2, which is equivalent to the combined thicknesses of the dummy bump 32 and the protrusion 224, is maintained between the circuit board 2 and the semiconductor chip 3. Consequently, no forming processing is required, and no short-circuiting occurs between the circuit board 2 and the edge of the semiconductor chip 3. Furthermore, because the dimension of the gap t2 is determined by the preset combined thicknesses of the dummy bump 32 and the protrusion 224, it need not be set too conservatively. Therefore, even a semiconductor device 11 which uses a bonding structure based on the single-point bonding method, can be made with thin profile and retain high reliability.

Furthermore, the dummy bump 32 does not raise the cost of the semiconductor chip 3 because it can be formed simultaneously with the bumps for bonding 31.

Since the planar structure of the semiconductor device 11 in this example is the same as that of the semiconductor device in Working example 1 shown in FIG. 1, the molding agent 4 can be injected into each of the holes, 231, 232, etc. of the device hole 23. Furthermore, air can escape through the through-hole 230 when the molding agent 4 is injected. Therefore, the injected molding agent 4 can flow smoothly.

In this example, the protrusion 224 of the conductive pattern 22 overlaps the dummy bump 32 of the semiconductor chip 3. However, if the protrusion 224 is sufficiently thick, it may overlap the active area 30 of the semiconductor chip 3, onto which an insulation coating has been applied.

Working Example 3

The basic structure of the semiconductor device in this example is the same as that of the semiconductor device in Working example 1. For this reason, where the functions are the same, the same notations have been used and detailed explanations omitted.

FIG. 5A is a longitudinal section that schematically shows the state of the semiconductor device in this example before the semiconductor chip is bonded to the circuit board, while FIG. 5B is a longitudinal section that schematically shows the state after the semiconductor chip is bonded to the circuit board.

In the semiconductor device 12 of this example in FIG. 5A, a device hole 23 has been formed on the side of the circuit board 2, and a lead 221 of the conductive pattern 22 protrudes into this hole. This conductive pattern 22 includes gold-plated leads. In this example, aluminum pads 38 have been formed on the semiconductor chip 3, and the lead 221 is bonded only to aluminum pad 38a (electrode for bonding). While aluminum pad 38a is necessary for the electrical circuit, aluminum pad 38b is not connected to any of the internal circuits of the semiconductor chip 3, and is not necessary for the electrical circuit. As can be seen in this example, this option is inexpensive, since no bumps are formed on the semiconductor chip 3.

The circuit board 2 possesses a superimposing area 211 which overlaps the semiconductor chip 3 when this semiconductor chip 3 is correctly positioned against the device hole 23. The conductive pattern 22 has also been formed in this superimposing area 211. The part of this conductive pattern 22 that overlaps the aluminum pad 38b has been formed as a protrusion 225 (spacer) which juts out farther than other parts of the conductive pattern 22. The protrusion 225 is formed by stopping the etching operation halfway in the area where the protrusion 225 is to be formed, when the conductive pattern 22 is being formed through etching. The part of the conductive pattern 22 that is positioned in the perimeter of the semiconductor chip 3 has been made thinner, and the protrusion 225 is thicker than this part.

In the semiconductor device 12 thus configured, the lead 221 is bent downward when the lead 221 and aluminum pad 38a are bonded by applying ultrasonic vibration to the lead 221 in the single-point bonding method, as shown in FIG. 5B. However, because the protrusion 225 is not bonded to the semiconductor chip 3, it is not flattened. Consequently, no short-circuiting occurs between the circuit board 2 and the edge of the semiconductor chip 3, since a gap t3, which is equivalent to the initial thickness of the protrusion 225, is maintained between the conductive pattern 22 and the semiconductor chip 3. Furthermore, because the thickness of the protrusion 225 does not change after the lead 221 is bonded to aluminum pad 38a, and the dimension of the gap t3 is determined by the preset initial thickness of the protrusion 225, the gap t3 need not be set too conservatively. Therefore, it is possible to achieve thin profile and high reliability in the semiconductor device 12 in this example. Additionally, because the protrusion 225 uses a part of the conductive pattern 22, it does not raise the cost of the circuit board 2.

Furthermore, the planar structure of the semiconductor device 12 in this example is the same as that of the semiconductor device in Working example 1. Therefore, the molding agent 4 can be injected into each of the holes, 231, 232, etc. of the device hole 23. Furthermore, air can escape through the through-hole 230 when the molding agent 4 is injected. Therefore, the injected molding agent 4 can flow smoothly.

Although the protrusion 225 of the conductive pattern 22 overlaps the aluminum pad 38b of the semiconductor chip 3 in this example, it may, for example, overlap the active area 30 of the semiconductor chip 3, onto which an insulation coating has been applied.

Other Working Examples

In addition to the above-mentioned working examples, if a superimposing area that overlaps the semiconductor chip is formed on a circuit board, and if a spacer, whose thickness does not change after the conductive pattern and the bump are bonded, is formed on this superimposing area or on the surface of the semiconductor chip that overlaps the superimposing area, it would also be acceptable to use a protrusion of the substrate that includes the circuit board itself, or an insulating protrusion that juts out from the active area of the semiconductor chip itself.

Figure 6:
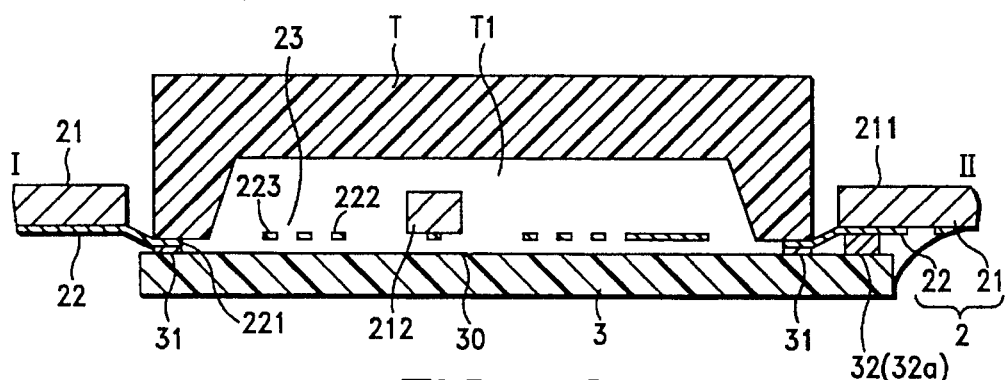
FIG. 6 shows another working example of the invention, and is a cross section that schematically shows the bonding process using the gang-bonding method used for the semiconductor device related to Working example 1.

Furthermore, it is possible to obtain effects similar to those obtainable with the single-point bonding method by using the gang-bonding method. When using the gang-bonding method, the bonding tool T should not have a flat bottom surface. Instead, as the structure of the bottom side of the bonding tool for gang bonding is schematically shown in FIG. 6, the bonding tool T should have a concave area T1 in order to avoid the superimposing areas 211 and 212 and the cross-over areas 222 and 223 of the conductive pattern.

Potential Industrial Field of Application

As explained above, in the semiconductor device in this invention, a superimposing area which overlaps the semiconductor chip, which is positioned on a device hole, is formed on the circuit board side. A specified gap is maintained between this superimposing area and the semiconductor chip by a dummy bump formed on the semiconductor chip side, or by a spacer, such as a protrusion, formed on the conductive pattern of the superimposing area. Therefore, since this invention can maintain a specified gap between the superimposing area and the semiconductor chip, without the need for forming the lead of the circuit board even when a single-bonding method is used, it is possible to produce a thin profile semiconductor device, to prevent short-circuiting at the edge of the semiconductor chip, and to obtain high reliability. Furthermore, because the forming process can be omitted, a higher level of productivity can be achieved. Additionally, leads can be positioned in the region that corresponds to the active area of the semiconductor chip by forming conductive patterns in the superimposing area, thus enhancing both pattern design freedom and the general applicability of the semiconductor chip.

When dummy bumps are formed on the semiconductor chip side, and protrusions of the conductive pattern are formed on the superimposing area of the circuit board, it is easy to form a wide gap between the circuit board and the semiconductor chip, equivalent to the combined thicknesses of the dummy bump formed on the semiconductor chip side and the protrusion.

If superimposing areas are present in the four corner areas of the device hole, it is possible to obtain uniform gaps, even in a large-size semiconductor chip. Furthermore, if superimposing areas are also formed along the sides of the device hole, it is possible to obtain gaps of even greater uniformity, even for a larger-size semiconductor chip.

The division of the device hole into multiple holes by the superimposing area allows the molding agent to flow smoothly, since it can be injected through each of the holes. Furthermore, even if a cross-over area traversing the divided hole is established in the conductive pattern, the cross-over area is reinforced by the superimposing area; thus improving circuit pattern design freedom while maintaining high reliability.

The formation of a through-hole in the superimposing area that passes through the approximate center of the device hole permits air to escape through the through-hole when a molding agent is injected; thus allowing the injected molding agent to flow smoothly.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A circuit board for mounting thereon a semiconductor chip having a plurality of bonding electrode bumps, comprising:

an insulating substrate having a device hole over which the semiconductor chip is disposed, said substrate including a superimposing area extending in said device hole and dividing said device hole into a plurality of holes;

a conductive pattern formed on said substrate and having a plurality of lead portions that protrude into the device hole and are bonded to the electrode bumps of the semiconductor chip; and a plurality of spacers formed on said superimposing area of said substrate and positioned between said substrate and the semiconductor chip, said spacers having a thickness that does not change after the lead portions of said conductive pattern and the electrode bumps of the chip are bonded together so as to maintain a predetermined distance between the circuit board and the semiconductor chip;

molding agent filled in said plurality of holes in said device hole.

2. The device of claim 1 wherein said spacers are dummy bumps.

3. The board of claim 1 wherein said device hole has an approximately quadrangular outline and said substrate further includes superimposing areas positioned at four corner areas of said device hole.

4. The board of claim 1 wherein said substrate further includes superimposing areas positioned along each side of said device hole.

5. The board of claim 1 wherein said substrate includes a superimposing area positioned inside said device hole, dividing said device hole into multiple holes.

6. The board of claim 1 wherein said superimposing area of said substrate extends through the approximate center of said device hole to divide said device hole into said plurality of holes.

7. The board of claim 6 wherein a portion of the superimposing area at the approximate center of said device hole includes a through hole.

8. The board of claim 6 wherein said conductive pattern includes a cross-over portion that traverses said device hole.

9. A semiconductor device, comprising:

a semiconductor chip having a plurality of bonding electrode bumps and spacers; and a circuit board including:
an insulating substrate having a device hole over which said semiconductor chip is disposed, said substrate including a superimposing area extending in said device hole and dividing said device hole into a plurality of holes;
a conductive pattern formed on said substrate and having a plurality of lead portions that protrude into the device hole and are bonded to the electrode bumps of said semiconductor chip;
wherein said spacers of said semiconductor chip are positioned between said superimposing areas and said semiconductor chip, and said spacers having a thickness that does not change after the lead portions of said conductive pattern and the electrode bumps of said chip are bonded together so as to maintain a predetermined distance between said circuit board and said semiconductor chip;
molding agent filled in said plurality of holes in said device hole.

10. The device of claim 9 wherein said spacers are dummy bumps that are not bonded to said conductive pattern.

11. The device of claim 10 wherein portions of said conductive pattern on said superimposing area overlap said dummy bumps.

12. The device of claim 10 wherein said device hole has an approximately quadrangular outline and said substrate further includes superimposing areas positioned at four corner areas of said device hole.

13. The device of claim 10 wherein said substrate further includes superimposing areas positioned along each side of said device hole.

14. The device of claim 9 wherein said substrate includes a superimposing area positioned inside said device hole, dividing said device hole into multiple holes.

15. The device of claim 10 wherein said superimposing area of said substrate extends through the approximate center of said device hole to divide said device hole into said plurality of holes.

16. The device of claim 15 wherein a portion of the superimposing area at the approximate center of said device hole includes a through hole.

17. The device of claim 15 wherein said conductive pattern includes a cross-over portion that traverses said device hole.

18. A semiconductor device, comprising:

a semiconductor chip having a plurality of bonding electrode bumps; and a circuit board including:
an insulating substrate having a device hole over which said semiconductor chip is disposed, said substrate including a superimposing area extending in said device hole and dividing said device hole into a plurality of holes;
a conductive pattern formed on said substrate and having a plurality of lead portions that protrude into the device hole and are bonded to the electrode bumps of said semiconductor chip; and
a plurality of spacers formed as protrusions of said conductive pattern and positioned between said conductive pattern and said semiconductor chip, and said spacers having a thickness that does not change after the lead portions of said conductive pattern and the electrode bumps of said chip are bonded together so as to maintain a predetermined distance between said circuit board and said semiconductor chip;
molding agent filled in said plurality of holes in said device hole.

19. The device of claim 18 wherein said semiconductor chip further includes dummy pads that overlap said spacers on said conductive pattern.

20. The device of claim 19 wherein said dummy pads of said chip include concave receptacles into which said spacers are disposed.

21. The device of claim 18 wherein said device hole has an approximately quadrangular outline and said substrate further includes superimposing areas positioned at four corner areas of said device hole.

22. The device of claim 18 wherein said substrate further includes superimposing areas positioned along each side of said device hole.

23. The device of claim 18 wherein said substrate includes a superimposing area positioned inside said device hole, dividing said device hole into multiple holes.

24. The device of claim 18 wherein said superimposing area of said substrate extends through the approximate center of said device hole to divide said device hole into said plurality of holes.

25. The device of claim 24 wherein a portion of the superimposing area at the approximate center of said device hole includes a through hole.

26. The device of claim 24 wherein said conductive pattern includes a cross-over portion that traverses said device hole.

\* \* \* \* \*

UNITED STATES PATENT AND TRADEMARK OFFICE
CERTIFICATE OF CORRECTION

PATENT NO.    : 5,563,445
DATED         : October 8, 1996
INVENTOR(S)   : Yoshitaka Iijima, et al.

It is certified that errors appear in the above identified patent and that said Letters Patent is hereby corrected as shown below:

Column 11, line 58, change "claim 10" to --claim 9--.

line 62, change "claim 10" to --claim 9--.

Column 12, line 4, change "claim 10" to --claim 9--.

Signed and Sealed this

Twenty-second Day of April, 1997

Attest:

BRUCE LEHMAN

Attesting Officer

Commissioner of Patents and Trademarks